United States Patent [19]
Huang

[11] 3,986,115
[45] Oct. 12, 1976

[54] TRANSIENT DIRECTION DETECTOR

[75] Inventor: Kwang-Ta Huang, Port Hueneme, Calif.

[73] Assignee: The United States of America as represented by the Secretary of the Navy, Washington, D.C.

[22] Filed: Jan. 20, 1975

[21] Appl. No.: 542,478

[52] U.S. Cl. .................................. 324/102; 324/52; 324/127; 324/133
[51] Int. Cl.² .................. G01R 19/14; G01R 31/08
[58] Field of Search ............... 324/102, 133, 52, 66, 324/67, 127

[56] References Cited
UNITED STATES PATENTS

| | | | |
|---|---|---|---|
| 3,753,089 | 8/1973 | Gunn et al. .......................... | 324/133 |
| 3,838,339 | 9/1974 | Brandt ................................. | 324/133 |

Primary Examiner—R. V. Rolinec
Assistant Examiner—Ernest F. Karlsen
Attorney, Agent, or Firm—Richard S. Sciascia; Joseph M. St.Amand; David O'Reilly

[57] ABSTRACT

A transient direction detector which indicates the occurrence of power line transients and their direction of propagation. The system is comprised of current and voltage sensors, a logic and control circuit which receives the transient current and voltage sensed and provides an output to an indicator circuit to show the direction of any transients on a power line. The current sensing circuit receives an input from an induction coil on an iron clamp around a power line. The voltage sensing circuit receives its input from a voltage sampling transformer directly connected across a power line. The logic and control circuit determines where the transient occurred by comparing the polarity received from the transient current and voltage sensing circuits.

12 Claims, 2 Drawing Figures

3,986,115

TRANSIENT DIRECTION DETECTOR

BACKGROUND OF THE INVENTION

This invention relates generally to circuits for detecting transients and more particularly relates to circuits for detecting transients on power lines and indicating the characteristics of the transient.

The increasing use of complex and very sensitive electronic equipment has necessitated the detection and elimination of electrical transients from power lines to permit uninterrupted and reliable operation of critical electronic equipment. Detection and location of the sources of electrical transients is therefore of prime importance in providing high quality power to critical equipment. Detection of transients in prior art circuits has required shutting down the equipment by opening a circuit breaker or blowing a fuze. On some occasions, these transients are only temporary and the equipment may be restarted after a short delay. However, the cause of the transient is not determined, and a recurrence may again shut down the equipment, causing a loss of precious computer time or use of other critical electronic equipment. If the transient occurs at infrequent intervals, the cause can be extremely difficult to locate. Further, if the transient is very large, it can result in permanent damage to the equipment if not eliminated.

The present invention provides a solution to the problem of transients by not only indicating when one occurs but also indicating the direction of their origin. This information is extremely helpful in determining the cause of the transient.

SUMMARY OF THE INVENTION

The purpose of the present invention is to detect transients on power lines serving complex electronic equipment and indicate from which direction the transient occurred. When a transient occurs on a power line, a transient voltage is always associated with the appearance of a transient current. The transient direction detector of the present invention senses the direction of transient current and the polarity of a transient voltage and compares them. The direction of transient current is determined by sensing the polarity of a current sample. The comparison is made in a logic and control circuit which in turn energizes an indicator light showing whether the transient occurred at the source or at the load. The logic and control circuit also blocks inputs from the voltage and current sensing circuits until an indication as to the direction of the transient being detected has been shown. When this occurs, the logic and control circuit then energizes an indicator light showing that the system is ready to be reset for detecting another transient. The voltage sensing circuit includes a circuit for assuring that the transient current and voltage are in phase when being compared in the logic and control circuit.

OBJECTS OF THE INVENTION

It is one object of the present invention to provide an indication of when a transient occurs on a power line supplying complex electronic equipment.

Another object of the present invention is to detect transients on power lines and to indicate the direction from which it came.

Still another object of the present invention is to detect transients on power lines for the purpose of determining their origin.

Another object of the present invention is the detection of transients on power lines for the purpose of eliminating them to provide uninterrupted and reliable operation of critical electronic equipment.

Other objects, advantages and novel features of the invention will become apparent from the following detailed description of the invention when considered in conjunction with the accompanying drawings.

DETAILED DESCRIPTION OF THE PREFERRED EMBODIMENT

Figure 1:
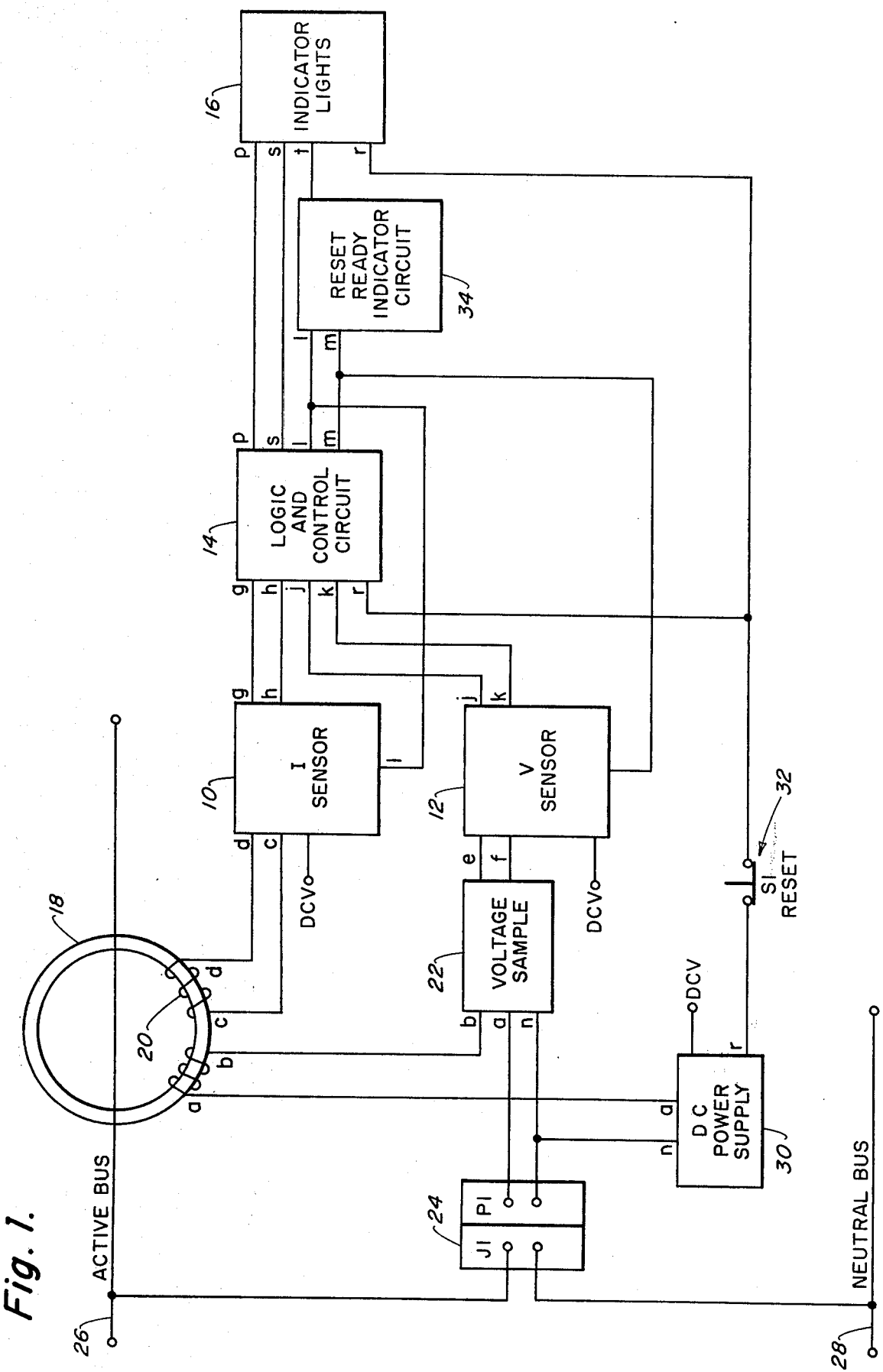
FIG. 1 is a block diagram of the transient direction detector showing the various circuits.

The two sources of transients identified above (i.e., injection of energy or change of impedance) theoretically can be replaced in an equivalent circuit by an equivalent transient voltage or current source at the place where the transient occurred. This substitution led to the observation that at any pair of points in the network, within an extremely short time after the equivalent transient source pulsed a transient into the system, the transient current always flows from the high transient voltage side to the low transient side. In other words, at the moment when the transient occurs, the transient current and voltage are in phase. Thus, it was determined that by sensing the information on the polarity of the transient voltage and the direction of the transient current at this critical moment and analyzing this information in a logic circuit, the direction of a transient along electrical lines can be determined. Consequently, the origin of the transient can be located by tracing the transient direction along the line to the load or the source.

To put it another way, an iron clamp having an induction coil will indicate which direction transient current is flowing in a line by whether or not there is a phase reversal in the sampled current. Lets say then that the iron clamp with an induction coil is marked so that when it is put on a power line it will reverse the phase of a transient current sample flowing from the load toward the source. Also, a properly polarized voltage sampling device across the power line will indicate the polarity of the transient. Now utilizing this information, one can determine whether a transient occurred at the source or the load by comparing the polarity of the transient voltage with the polarity of the transient current sample. Since the transient voltage and current are in phase at the time of occurrence, and since the current sampling device reverses the polarity of any transient occurring at the load, a transient voltage and current opposite in polarity will indicate a transient occurring at the load. Conversely, a transient voltage and current sampled which are both of the same polarity indicates that the transient occurred at the source.

For example, if a positive transient occurs at the load, transient current will flow from the load to the source. The current sampling device will reverse the polarity of the transient current sample indicating this fact. The transient voltage sampling device will indicate a positive polarity. Now, if a logic circuit compares the polarity of the transient voltage sampled with the polarity of the transient current sampled, they will be opposite. Since the transient voltage and current are in phase at the instant that the transient occurs, the origin of the transient must be in the direction of the load. Thus, by setting the current sensing device to determine the direction of the transient current and comparing that with the polarity of the transient voltage, one can determine the origin of the transient.

Referring now to FIG. 1, there is shown a transient direction detector circuit comprised of current sensor 10, voltage sensor 12, logic and control circuit 14, and an indicator circuit 16. The current sensor 10 receives a current sample from an iron clamp 18 having a coil 20 wound on it. Voltage sampling is by means of a voltage sampling and phase compensation circuit 22 directly tapped to the power line through a connector 24. The power line is comprised of an active bus (i.e., "hot line") 26 and a neutral bus 28. Power is supplied by d.c. power supply 30. Switch 32 (S1) permits resetting of the logic and control circuit for detecting another transient after a transient has been detected and the direction of its origin indicated by the indicator circuit 16. An output from the logic control circuit 14 blocks inputs from the current sensor circuit 10 and voltage sensor circuit 12 and energizes reset ready indicator circuit 34. The reset ready indicator circuit 34 energizes a light on the indicator circuit 16.

Figure 2:
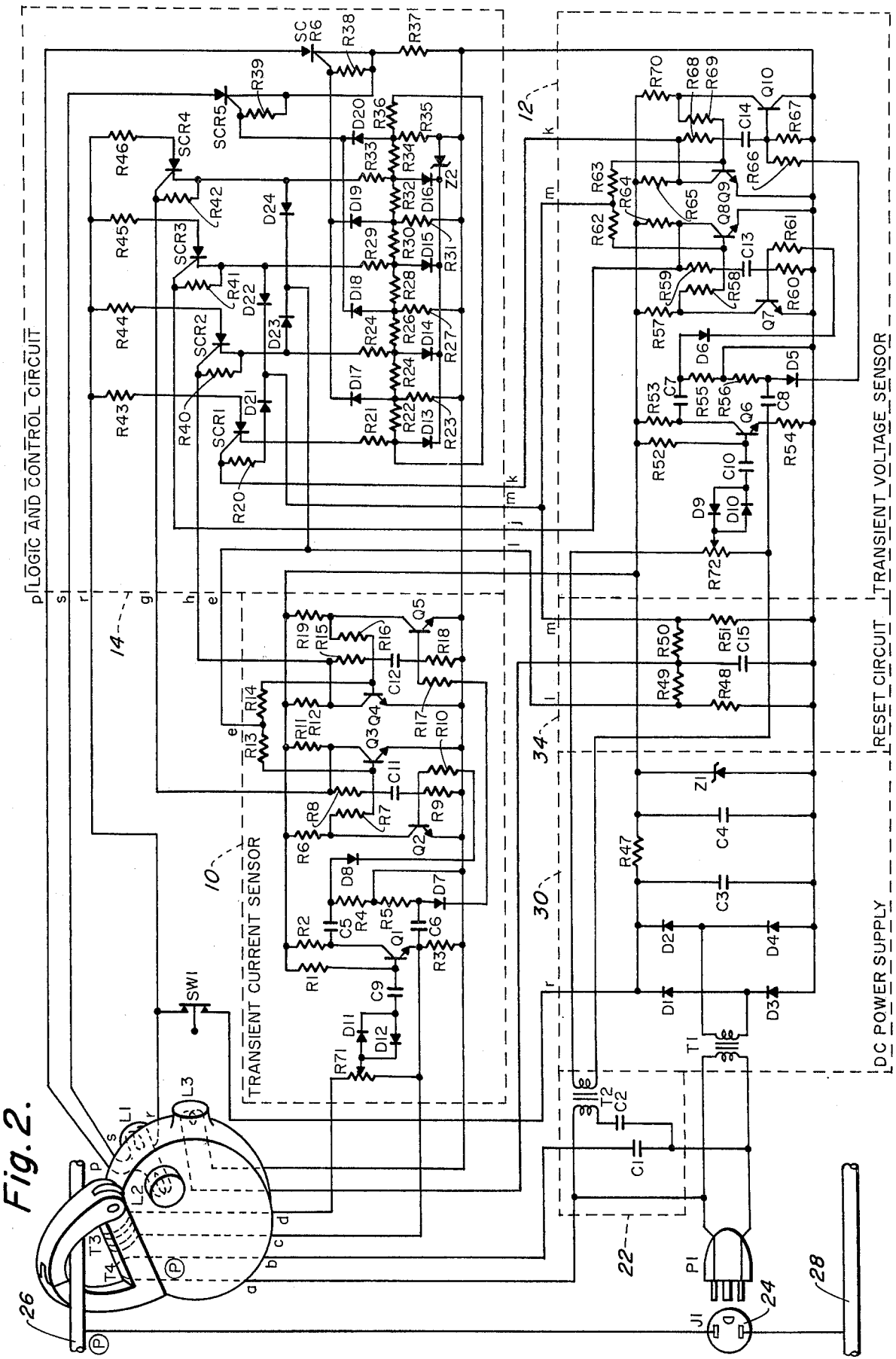
FIG. 2 is a schematic diagram of the transient direction detector.

FIG. 2 is a schematic circuit diagram of the transient direction detector shown in block form in FIG. 1. An iron clamp 18 wound with an induction coil 20 (T3) is used as a transient current sampler. When a transient occurs on the electrical line 26 on which the iron clamp 18 has been installed, an induced voltage will appear on the coil 20 with its polarity coinciding with the direction of the transient current flowing on the line. Thus, current sensing circuit 10 is able to collect information on the polarity of the induced voltage, which in turn will provide the direction of the transient current. The current sensing circuit 10 consists of input controller, polarity selector, and two monostable multivibrators. The input controller is comprised of two diodes (D11, D12 and potentiometer R71) and is used for preventing the normal 60 hz voltage, induced by 60 hz normal current on the electrical line from disturbing the sensor logical circuit. A positive transient voltage signal will pass through diode D11, transistor Q1, capacitor C5, and diode D8 to trigger the first monostable multivibrator comprised of transistors Q2 and Q3 and its associated circuitry. A negative transient voltage signal will pass through diode D12, transistor Q1, capacitor C6, and diode D7 to trigger the second monostable multivibrator comprised of transistors Q4 and Q5 and its associated circuitry. The triggering of either monostable multivibrator in the current sensing circuit 10 will cause conduction of silicon-controlled rectifier SCR2 or SCR4, respectively, in the logic and control circuit 14.

As was indicated previously, a transient voltage is always associated with the appearance of a transient current on the electrical line 26. The information on the polarity of this transient voltage is collected by induction coil T2 in the voltage sampling circuit 22 and transmitted to the voltage sensing circuit 12. The structure of the voltage sensing circuit 12 is identical to that of the current sensing circuit 10. Thus, it will send an appropriate signal, according to the polarity of the transient voltage, to trigger either of silicon control rectifiers SCR1 or SCR3 in the logic and control circuit 14. The combination of either SCR1 or SCR3 with SCR2 or SCR4 conducting results in triggering either SCR5 or SCR6, which activates the indicating circuit comprised of indicating lights L1 or L2 mounted on a housing with the iron clamp 18. Light L1 or L2 indicates the direction in which the transient originated along the electrical line 26, according to the direction of the transient current sampled by iron clamp 18.

The reset ready indicator circuit 34 is activated by either SCR1, SCR2, SCR3 or SCR4 conducting. Reset ready indicator circuit 34 in turn energizes indicator light L3 to show that the transient direction detector is ready to be reset by pushbutton switch S1. The signal which activates reset ready indicator circuit 34 also turns on transistors Q3 and Q4 of the current sensing circuit 10 and transistors Q8 and Q9 of the voltage sensing circuit 12, blocking all signals coming from these circuits. Therefore, the logic and control circuit 14 is preserved in the same state as it was when it was activated, until reset by pushbutton switch S1.

The voltage sampling circuit 22 also provides phase compensation by coil T4 on iron clamp 18 and capacitors C1 and C2. These components are for the purpose of extending the time when the transient current and voltage are in phase and increasing the sensitivity of induction coils T1 and T2. During the time when logic and control circuit 14 is comparing the voltage and current samples, additional signals from current sensing circuit 10 and voltage sensing circuit 12 are blocked until light L1 or L2 indicates whether the transient occurred at the source or load and light L3 illuminates, indicating the detector is ready to be reset. Light L3 is illuminated by reset ready indicator circuit 34 after lights L1 or L2 indicate the origin of the transient. As soon as light L3 is illuminated, reset switch S1 may be operated to turn off either light L1 or L2 and reset the detector for analyzing another transient.

Power supply 30 converts the line voltage of 120 volts, 60 cycle a.c. power to d.c. power and furnishes the power to the circuits in the detector. The voltage sampling circuit 22 and power supply 30 are connected across the a.c. line 26 and 28 through a connector 24. Connector 24 may be an alligator clamp or any other suitable quick-connect/disconnect type of device.

The correct indication of a transient along a power line by the detector is, of course, dependent upon the polarities of the current and voltage collected by induction coils T2 and T3. Therefore, the polarities of the electrical power cord and the electrical line on which the iron clamp 18 is installed must be defined. That is, we must mark the iron clamp to indicate which direction the current is flowing according to the polarity of the current sampled in the current sensor circuit 10. Thus, the capital "P" marked on the iron clamp indicates that the positive current sample indicates current is flowing from the source to the load. When the transient current is flowing from the load to the source with the iron clamp in the position shown, a negative current sample will be sensed in the current sensing circuit 10. Now the positive terminal of connector 24 is marked with a P for connection to the active bus (i.e., hot line) so that voltage sensing circuit 12 will indicate a positive when a positive transient occurs. Thus, the iron clamp with the mark P is attached to the active bus and must face the capital P on the connector 24. With the voltage and current samples thus defined, the direction and origin of a transient will automatically be indicated by the lights L1 or L2. With the iron clamp 18 and connector 24 marked thusly, indicator lights L1 and L2 can be marked to indicate the direction and origin of a transient as from the source or from the load. Lets say that indicator light L1 is marked to indicate a transient coming from the source.

Let's assume a positive transient occurs from the direction of the source. Since the positive terminal of connector 24 is connected to the active bus, the voltage sensing circuit will detect a positive voltage pulse. Simultaneously, iron clamp 18 samples the current in the active bus 26. Since current flows from the high transient side to the low transient side, a positive current sample will be delivered to the current sensing circuit 10. The positive current pulse will pass through diode D11, energizing a multivibrator comprised of Q2 and Q3, and be delivered to logic and control circuit 14 to activate SCR4. The positive voltage pulse will pass through diode D10, activating a multivibrator comprised of Q7 and Q8 and will energize SCR3. The positive current sample indicates that current is flowing from the source to the load. However, this does not indicate whether the transient occurred at the source or at the load because the transient could be a negative transient occurring at the load, in which case current would flow from the source to the load or a positive current occurring at the source which again would result in a positive current flowing from the source to the load. Thus, the voltage sampled indicating that it was positive when compared with the current sampled pulse in the logic and control circuit 14 would indicate that the transient must have occurred in the direction of the source. This would result in logic and control circuit 14 energizing light L1 through SCR5. Thus, it can be seen that when the voltage sample and the current sample are both positive or both negative, the transient must have occurred in the direction of the source. When the voltage sampled and the current sampled are opposite in polarity, the transient must have occurred in the load.

This can be seen by assuming a positive transient occurring at the load. The voltage sampling circuit will sense a positive pulse and the current sampling circuit, which will reverse the polarity of a transient current flowing from the load to the source, will then sense a negative pulse. When the positive voltage pulse and negative current pulse are compared in the logic and control circuit 14, they will result in energizing indicator light L2, indicating a transient occurring at the load.

The reason that the detector works so effectively is because the transient current and transient voltage are of the same polarity (i.e., in phase) when the transient occurs. For a transient occurring at the load, the voltage sampled by voltage sensing circuit 12 will have the same polarity as the transient while the current sensed by current sensing circuit 10 will be reversed when sampled by iron clamp 18. Thus, when the two samples are compared in logic and control circuit 14, the opposite polarity will indicate a transient occurring at the load. For a transient occurring at the source, the voltage sensed by the voltage sensing circuit 12 and the current sensed by the current sensing circuit 10 will have the same polarity when they reach the logic and control circuit 14, which will thus energize indicating light L1, indicating a transient occurring at the source.

The transient direction detector can be used effectively to locate the origin of a transient by moving the iron clamp along the line until the detector indicates that the iron clamp has been moved past the transient. That is, if the iron clamp indicates that the transient is occurring in the direction of the load, moving the iron clamp down the power line toward the load until it indicates that the transient is coming from the direction of the source, one can determine approximate location of the transient. Since transients often occur at infrequent intervals, this detector can be extremely valuable in determining the origin and cause of transients, thus eliminating a lot of down time.

In the past, sensitive electronic equipment would merely shut down when the transient occurred and the operator would have no knowledge of what caused the transient or where it occurred. The operator would then merely wait for a short period, then restart the equipment if the transient was no longer present. If the transient is no longer present on the line, the equipment will continue to operate until it occurs again, shutting down the system. Each recurrence of the transient provides the operator with no additional information as to its source and may eventually result in damaging the equipment or result in more and more loss of time until there is a complete failure. With the transient direction detector of the present invention, repeat occurrences of a transient provide additional information as to its origin and location, and frequently it can be corrected before any damage to the equipment or substantial loss of time has occurred.

The iron clamp 18 is a standard current sampling clamp having coils T3 and T4 wound thereon and a housing 34 having lights L1, L2 and L3 mounted thereon. The iron clamp 18 is connected by a cable to the unit for sampling and comparing the voltage and current samples. An important feature of the detector is that it does not disturb the normal operation of a power system or equipment serviced by the power line.

Obviously many modifications and variations of the present invention are possible in light of the above teachings. It is therefore to be understood that within the scope of the appended claims the invention may be practiced otherwise than as specifically described.

I claim:
1. A system for detecting the origin of a transient in a line comprising:
   a. means for detecting and sampling the transient current;
   b. means for detecting and sampling the transient voltage;
   c. logic means for comparing the transient current sample with the transient voltage sample; and
   d. indicating means receiving the output of the logic means and indicating in which direction the transient occurred from the point where the transient current sample was taken.

2. The transient detecting system of claim 1 wherein the transient current sampling means and the transient voltage sampling means each comprise
   a. a pair of polarity selecting diodes; and
   b. a pair of monostable multivibrators.

3. The transient detecting system of claim 2 wherein said transient current sampler comprises:
   a. an iron clamp;
   b. a coil wound on said iron clamp; and
   c. said iron clamp designated to provide a positive sample for current in one direction and a negative sample for current in the opposite direction.

4. The transient detector of claim 2 wherein said transient voltage sampler comprises:

a. a connector for attachment across a line; and b. a transformer receiving the transient voltage sample from the connector.

5. The transient detector of claim 4 including means for compensating for any phase shift between the transient current sample and transient voltage sample.

6. The transient detector of claim 1 wherein said logic means comprises four parallel connected silicon controlled rectifiers connected to respond to the transient voltage or current of either polarity, respectively.

7. The transient detector of claim 6 including feedback means to block the outputs of the transient current and voltage polarity sensing circuits while the logic means is analyzing a transient.

8. The transient detector of claim 7 wherein said feedback means includes:

a. a reset ready indicator; and b. a switch to reset the detector after the direction of origin of a transient has been indicated.

9. A method of detecting the origin of a transient on a line comprising:

a. sampling the transient current;

b. sensing the polarity of the current sample with the polarity defined as indicating the direction of the transient current;

c. detecting the polarity of a transient voltage;

d. comparing the polarity the transient current sample with the polarity of the transient voltage in a logic circuit to determine the direction of the transient along the electrical line; and e. activating an indicating circuit according to the direction of origin of the transient along the line determined in the logic circuit.

10. The method of claim 9 including blocking the outputs of the transient current direction detector and transient voltage polarity detector until a transient has been analyzed.

11. The method of claim 10 wherein said blocking step comprises feeding back the output of the comparing circuit to disable the transient current and voltage detectors.

12. The method of claim 11 including compensating for a phase shift between the transient current sample and transient voltage.

* * * * *